(12) United States Patent
Takahashi et al.

(10) Patent No.: US 8,530,841 B2
(45) Date of Patent: Sep. 10, 2013

(54) INFRARED SENSOR, ELECTRONIC DEVICE, AND MANUFACTURING METHOD OF INFRARED SENSOR

(75) Inventors: Masatake Takahashi, Tokyo (JP); Yasuhiro Sasaki, Tokyo (JP); Hiroshi Sakai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/256,704

(22) PCT Filed: Apr. 5, 2010

(86) PCT No.: PCT/JP2010/002494
§ 371 (c)(1),
(2), (4) Date: Sep. 15, 2011

(87) PCT Pub. No.: WO2010/134255
PCT Pub. Date: Nov. 25, 2010

(65) Prior Publication Data
US 2012/0049067 A1 Mar. 1, 2012

(30) Foreign Application Priority Data
May 18, 2009 (JP) ................................. 2009-120127

(51) Int. Cl.
*H01L 37/00* (2006.01)
*G01J 5/00* (2006.01)

(52) U.S. Cl.
USPC .................................... 250/338.2; 250/338.3

(58) Field of Classification Search
USPC ............ 250/338.2, 349, 338.3; 257/E31.002
See application file for complete search history.

(56) References Cited

U.S. PATENT DOCUMENTS

| | | | |
|---|---|---|---|
| 2001/0053075 A1* | 12/2001 | Parker et al. ..................... | 362/31 |
| 2004/0232336 A1* | 11/2004 | Antesberger ............... | 250/338.1 |
| 2009/0179840 A1* | 7/2009 | Tanaka et al. .................. | 345/87 |
| 2009/0294683 A1* | 12/2009 | Perna ....................... | 250/370.11 |

FOREIGN PATENT DOCUMENTS

| | | |
|---|---|---|
| JP | 60-3433 U | 1/1985 |
| JP | 3-215775 A | 9/1991 |
| JP | 5-346346 A | 12/1993 |
| JP | 6-331438 A | 12/1994 |
| JP | 7-92025 A | 4/1995 |
| JP | 08094438 A * | 4/1996 |
| JP | 10-132656 A | 5/1996 |
| JP | 10-221162 A | 8/1998 |
| JP | 2004064087 A | 2/2004 |
| JP | 2007187599 A | 7/2007 |
| JP | 2007292461 A | 11/2007 |
| JP | 2009186374 A | 8/2009 |
| WO | 2007108441 A | 9/2007 |

OTHER PUBLICATIONS

International Search Report for PCT/JP2010/002494 mailed May 11, 2010.

* cited by examiner

*Primary Examiner* — David Porta
*Assistant Examiner* — Faye Boosalis

(57) ABSTRACT

The present invention aims to reduce a size and improve quality of an infrared sensor. An infrared sensor (203) according to the present invention includes a substrate (202) and an infrared detection element (201). A principal surface of the substrate (202) includes a convex shape. The infrared detection element (201) is formed over the principal surface including the convex shape of the substrate (202). Further, as for the infrared detection element (201), an entire light-receiving surface includes a planar shape. Then, it can be the small-sized infrared sensor (203) with improved quality.

9 Claims, 6 Drawing Sheets

INFRARED SENSOR, ELECTRONIC DEVICE, AND MANUFACTURING METHOD OF INFRARED SENSOR

TECHNICAL FIELD

The present invention relates to an infrared sensor, an electronic device, and a manufacturing method of the infrared sensor.

BACKGROUND ART

As an infrared sensor, a pyroelectric infrared sensor using a pyroelectric effect, a resistance variable infrared sensor using a temperature change rate of resistance in which a material has, an junction infrared sensor using a change in electrical characteristics of a semiconductor pn junction or the like are known. Especially the pyroelectric and the resistance variable infrared sensor that can operate at a normal temperature are used for fire detection or human body detection. Further, these infrared sensors have an advantage that the infrared spatial distribution can be easily imaged in high resolution by placing infrared detection elements in an array, and they are used for security in a dark place and flaw detection in the structural material or the like.

On the other hand, by advance in information communication technology in recent years and expansion of network infrastructure, there is a movement of using a new sensor such as energy-saving of building air-conditioning, and a small-sized sensor device with a low manufacturing cost is desired to realize the system that uses many sensors at the same time.

A basic configuration of the pyroelectric infrared sensor array is explained with reference to FIGS. 7A and 7B. FIG. 7A is a cross-sectional diagram showing the configuration of the pyroelectric infrared sensor array. FIG. 7B is a perspective view showing the configuration of the pyroelectric infrared sensor array. As shown in FIG. 7A, the pyroelectric infrared sensor array is composed of an infrared detection element 101, a substrate 102, an optical diffraction lens 103, and an optical filter 104. The infrared detection element 101 is composed of pyroelectric ceramic and a single crystal including a pyroelectric effect. The substrate 102 is composed, of a silicon substrate or a glass substrate.

An array of the infrared detection elements 101 is formed and integrally bonded by the film deposition process or attachment to the substrate 102, and sealed through formation of electrodes and wires for electric connections. The optical filter 104 which transmits only the infrared rays of a wavelength suitable for a detecting object is provided in the sealed package. Moreover, the optical diffraction lens 103 such as a Fresnel lens is used to ensure a wide viewing angle, and a wide viewing angle is realized (see PTL 1). Infrared distribution in the space is converted into electrical signals as a polarization state change of the array of the infrared detection elements 101 surface, and is output as image information through a signal amplifying circuit and a digital processing circuit (see PTL 2).

Further, in the pyroelectric infrared sensor, in order to realize a wide viewing angle without using an optical diffraction element such as a lens, PTL 3 discloses a technique for processing a pyroelectric member and using a plurality of curved surfaces or planar surfaces as a light-receiving surface. Furthermore, PTL 4 discloses a technique for providing a plurality of sensors in an array over a flexible substrate and using it as a radiation imaging element.

CITATION LIST

Patent Literature

PTL 1: Japanese Unexamined Patent Application Publication No. 2007-292461
PTL 2: Japanese Unexamined Patent Application Publication No. 2007-187599
PTL 3: Japanese Unexamined Patent Application Publication No. 5-346346
PTL 4: Japanese Unexamined Patent Application Publication No. 2004-64087

SUMMARY OF INVENTION

Technical Problem

Here, the infrared sensors disclosed in PTL 1 and 2 are installed and used in a building that requires security and a relatively large-sized electronic device or the like. Therefore, there is no consideration on reduction of the size of the infrared sensor to facilitate embedding to a small electronic device. Further, there is no consideration on reduction of the cost of the infrared sensor. Furthermore, there is no consideration on using many infrared sensors at the same time.

Moreover, as mentioned above, the optical diffraction element for collecting light requires the pyroelectric infrared sensor for collecting light and the reduction in size is difficult. Additionally, there is a problem that the manufacturing process is complicated, the cost is high, and also the reduction in size is difficult due to the configuration of sealing the infrared detection element and the substrate.

As for the pyroelectric infrared sensor disclosed in PTL 3, the light-receiving surface faces a plurality of direction, and it is possible to expand viewing angles. However, structurally, infrared rays are directly irradiated to the pyroelectric member in which an electrode is not formed, and detection sensitivity will decrease. Moreover, when considering the reduction in the size of the substrate, in the present invention that uses the pyroelectric member itself as the substrate, the reduction in size is difficult in terms of the manufacturing process.

In the flexible sensor aiming for imaging radiation that is disclosed in PTL 4 aims to detect the radiation that propagates through with high linearity. Accordingly, when using it for detecting infrared rays indicating a larger diffraction effect as compared with radiation, there is a high possibility that a plurality of detection elements receive the infrared rays of the same radiation source, it leads to "smearing" and "blurring" at the time of imaging, and thus there is a problem in respect of positional resolution. Furthermore, from a point of the privacy protection which is increasing its significance in recent years, there is a problem that the installment is avoided since an excessively high resolution array infrared sensor and a CCD camera can identify an individual.

The present invention is made in view of the above problems, and the purpose is to provide a small-sized infrared sensor with improved quality, an electronic device, and a manufacturing method of the infrared sensor.

Solution to Problem

An infrared sensor according to the present invention includes a substrate with a principal surface including a convex shape and a plurality of infrared detection elements that are formed over the principal surface including the convex shape and has an entire light-receiving surface including a planar shape.

On the other hand, a manufacturing method of an infrared sensor according to the present invention includes step of forming a plurality of infrared detection elements over a principal surface including a convex shape of a substrate so that an entire light-receiving surface includes a planar shape.

Advantageous Effects of Invention

According to the present invention, it is possible to provide a small-sized infrared sensor with improved quality, an electronic device, and a manufacturing method of the infrared sensor.

DESCRIPTION OF EMBODIMENTS

Hereinafter, an exemplary embodiment of the present invention is described with reference to the drawings. Note that in a configuration of each exemplary embodiment explained below, the same numeral is given to the same configuration unit, and duplicate explanation is omitted.

Figure 1A:
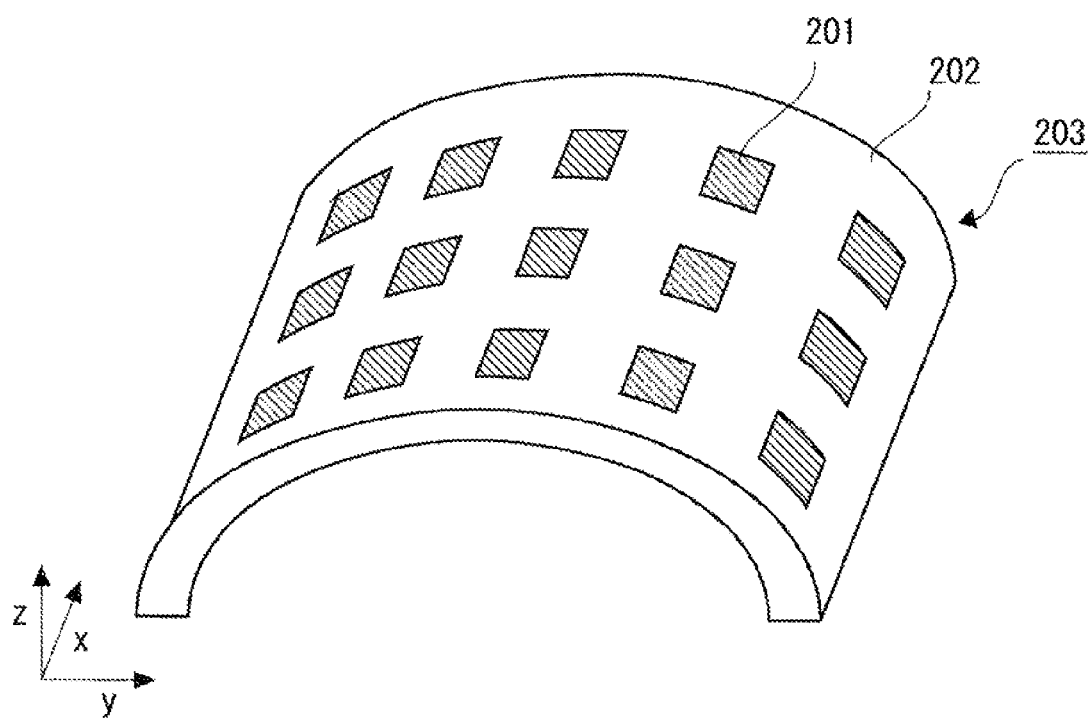
FIG. 1A is a view showing a configuration of a pyroelectric infrared sensor according to an exemplary embodiment.
Figure 1B:
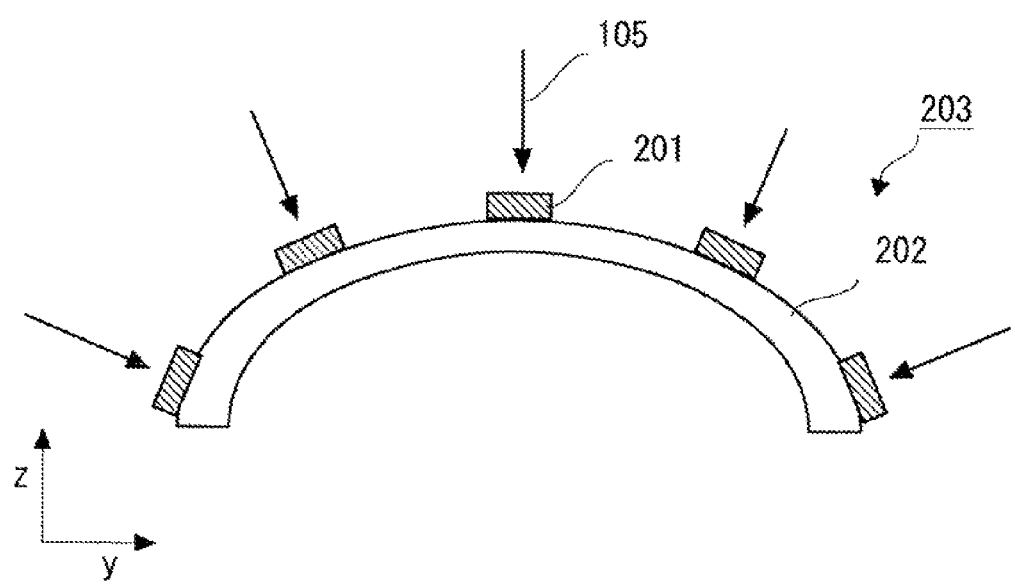
FIG. 1B is a view showing the configuration of the pyroelectric infrared sensor according to the exemplary embodiment.

First, an infrared sensor according to this exemplary embodiment is explained with reference to FIGS. 1A and 1B. There are a pyroelectric infrared sensor using a pyroelectric effect, a resistance variable infrared sensor using a temperature change rate of the resistance in which the material has, a junction infrared sensor using electrical property change of a semiconductor pn junction, or the like as the infrared sensor. Here, the pyroelectric infrared sensor is used as an example and explained as the infrared sensor. FIG. 1A is a perspective view showing a configuration of a pyroelectric infrared sensor 203 according to this exemplary embodiment. FIG. 1B is a cross-sectional diagram showing the configuration of the pyroelectric infrared sensor 203.

The pyroelectric infrared sensor 203 includes an infrared detection element 201 and a substrate 202. The substrate 202 includes two opposing principal surfaces, and a plurality of infrared detection elements 201 are formed over one principal surface. The principal surface in which the infrared detection elements 201 are provided in the substrate 202 includes a convex shape projected towards the infrared detection element 201 side. In FIGS. 1A and 1B, the top surface of the substrate 202 includes the convex shape projected upward. Accordingly, the top surface of the substrate 202 includes the convex shape projected towards the positive direction of the z axis. Further, this convex shape is provided by projecting a substantially central part in the y axis direction. Note that as the substrate 202 includes a substantially uniform thickness, a lower surface of the substrate 202 includes a concave shape that hollows towards the positive direction of the z axis.

Moreover, the substrate 202 includes a curved surface shape and a planar shape at least in the principal surface in which the infrared detection element 201 is provided. Accordingly, as shown in FIG. 1B, the cross-sectional shape of the top surface of the substrate 202 when cutting vertically in the x axis direction includes a straight line and a curve. Specifically, this cross-sectional shape is a substantially arc shape. On the other hand, the cross-sectional shape of the top surface of the substrate 202 when cutting vertically in the y axis direction does not include a curve, but has a straight line. Accordingly, the cross-sectional shape of the substrate 202 at this time is a substantially rectangular shape. Then, as shown in FIG. 1A, the top surface of the substrate 202 curves in substantially semicylindrical shape. Note that the shape viewed from the principal surface of the substrate 202 is a substantially rectangular shape. Here, the x axis direction, the y axis direction, and the z axis direction are perpendicular to each other. Note that as described above, the z axis direction is a projecting direction of the top surface of the substrate 202.

A metallic material (an aluminum alloy, a copper alloy, iron, an iron-based alloy, titanium, and a titanium alloy, etc.) and a resin material (an epoxy resin, an acrylic resin, polyimide, and polycarbonate, etc.) and a ceramics material (alumina, silica, magnesias, and those compounds and composites, etc.) or the like can be selected and used for the material of the substrate 202 according to a desired shape and an operating environment.

The infrared detection element 201 receives infrared rays 105. Substantially entire light-receiving surface of the infrared detection element 201 is planar. Specifically, as shown in FIG. 1B, substantially entire top surface of the infrared detection element 201 is planar. In this exemplary embodiment, a plurality of infrared detection elements 201 are formed only over the planar shape in the top surface of the substrate 202. Accordingly, the infrared detection element 201 is not formed over the curved surface shape in the top surface of the substrate 202. In other words, the substrate 202 includes a curved surface shape in the region other than the region where it is bonded to the infrared detection element 201. Specifically, the top surface of the substrate 202 includes a curved surface shape between the infrared detection elements 201 which are adjacent in the y axis direction. Then, by forming the infrared detection element 201 to have substantially the uniform thickness, the light-receiving surface of the infrared detection element 201 is made planar. Note that the shape viewed from the principal surface of the infrared detection element 201 is a substantially rectangular shape.

As mentioned above, the substrate 202 includes a convex shape on the top surface. Therefore, the light-receiving surfaces of the plurality of infrared detection elements 201 respectively turn to different directions. Then, each infrared detection element 201 receives the infrared rays 105 entered from a different direction. Accordingly, the viewing angle of infrared detection can be expanded. In FIGS. 1A and 1B, a detecting region of the y axis direction can be expanded.

Further, the plurality of infrared detection elements 201 are bonded and placed in an array over the substrate 202. In other words, the substrate 202 supports the array-like arranged infrared detection elements 201. In FIG. 1, as for the infrared detection element 201, five of them are placed at an equivalent interval along the y axis direction, and three of them are placed at an equivalent interval along the x axis direction. Accordingly, a lattice pattern of three rows×five columns of the infrared detection element 201 are placed.

The infrared detection element 201 is composed of a pyroelectric film including opposing two principal surfaces and an electrode layer formed over the principal surface of the pyroelectric film (both are not shown). In the pyroelectric film, a surface polarization state changes according to the state of the infrared rays 105 to receive. Specifically, when the pyroelectric film is irradiated with the infrared rays 105, a surface charge caused by the pyroelectric effect is induced on the electrode layer surface according to an irradiation amount of infrared rays and a wavelength. Then, by measuring the charge to be induced using an appropriate electronic circuit as electronic signals, the infrared rays 105 can be detected. Moreover, an electrode layer is formed over substantially the entire principal surface of the pyroelectric film. Then, it is possible to prevent the pyroelectric film in which the electrode layer is not formed from being irradiated with the infrared rays 105. Therefore, the detecting sensitivity of the pyroelectric infrared sensor 203 improves.

The quality of the material of the pyroelectric film is not limited, and it is formed by a pyroelectric member and a ferroelectric member which include the pyroelectric effect. Specifically, organic pyroelectric materials, such as lead zirconate titanate oxide ceramics, lithium tantalate ceramics, and polyvinylidene fluoride may be used as the pyroelectric film. Among them, for example, lead zirconate titanate oxide ceramics which has a high pyroelectric coefficient and can produce the pyroelectric effect at the maximum is desirable.

It is necessary to provide an electrical connection between the infrared detection element 201 and the substrate 202. Therefore, the electrical wiring is formed when the electrical conductivity of the material is low. As the electrical wiring, the metallic wiring or the like which is formed by the plating method, for example, can be used. Other than the plating method, the wire bonding method can be used for the connection between the electrode layer and the electric wiring formed in the upper part of the infrared detection element 201. The pyroelectric infrared sensor 203 according to this exemplary embodiment is composed as described above.

The pyroelectric infrared sensor 203 according to this exemplary embodiment is provided with a substrate 202 including a principal surface including a convex shape and a plurality of infrared detection elements 201 that are formed over the substrate 202 and include a substantially entire light-receiving surface has a planar shape. Accordingly, the light-receiving surface of the infrared detection element 201 respectively turns different direction. Therefore, it is possible to detect a wide region of the infrared spatial distribution without using the optical diffraction element such as a lens. Accordingly, the viewing angle of the infrared detection can be expanded.

Figure 7A:
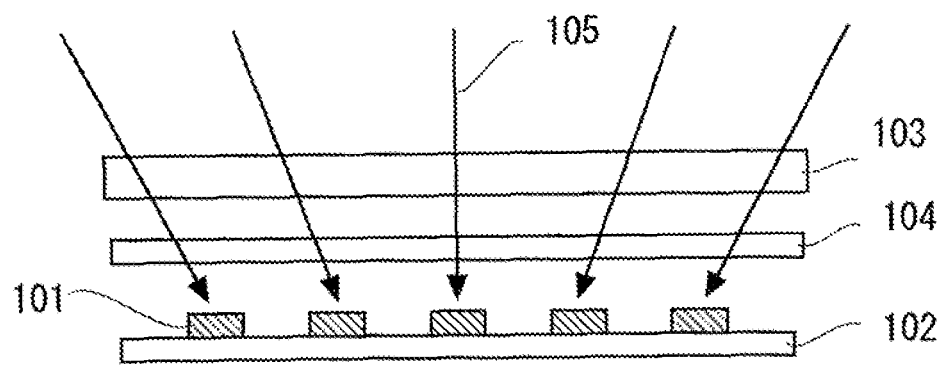
FIG. 7A is a view showing a configuration of a related pyroelectric infrared sensor array.
Figure 7B:
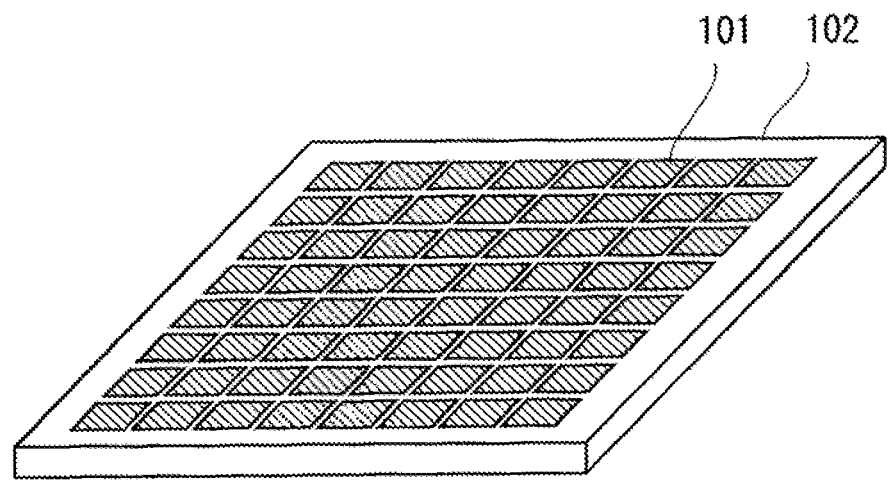
FIG. 7B is a view showing the configuration of the related pyroelectric infrared sensor array.

Moreover, it is not necessary to seal the infrared detection element 201 for improving the infrared detecting sensitivity. As described so far, as the optical diffraction element, the infrared filter, and the seal are not necessary, the configuration can be simplified. That is, as compared with the pyroelectric infrared sensor shown in FIGS. 7A and 7B, it is possible to realize the pyroelectric infrared sensor which is remarkably smaller-sized with a lower cost. Further, by reducing the size of the pyroelectric infrared sensor 203, it becomes easier to embed it to a small-sized electronic device such as a personal computer. Furthermore, as the substantially entire light-receiving surface of the infrared detection element 201 includes a planar shape, the infrared rays 105 received by one infrared detection element 201 can be narrowed. Accordingly, as compared with the case in which the light-receiving surface includes the curved surface shape, only the infrared rays 105 irradiated from a particular direction can be easily received. Therefore, the positional resolution improves and the infrared spatial distribution change can be accurately detected.

On the other hand, in the technique disclosed in PTL 4, the substrate includes the curved surface shape, and a photodiode is provided over the curved surface shape. Therefore, the light-receiving surface of the photodiode is considered to include the curved surface shape. Thus, when detecting the infrared rays indicating a larger diffraction effect as compared with radiation, there is a high possibility that the photodiode receives the infrared rays of the same radiation source. That is, there is a possibility that one photodiode receives the infrared rays irradiated from many directions. Therefore, it is not possible to perform accurate detection.

Further, the substrate 202 preferably includes a substantially planar shape in the principal surface which includes a convex shape, and the infrared detection element 201 is preferably formed only over the substantially planar shape. Accordingly, the substantially entire light-receiving surface of the infrared detection element 201 can be easily planar shape. In this case, the infrared detection elements 202 may only have the substantially uniform thickness, and thus it is simple and the productivity improves.

Moreover, the pyroelectric infrared sensor 203 according to this exemplary embodiment can be provided to the electronic device, and this pyroelectric infrared sensor 203 can detect a temperature distribution change in the space. Alternatively, the pyroelectric infrared sensor 203 according to this exemplary embodiment can be provided to the electronic device, and this pyroelectric infrared sensor 203 can also detect a movement of a human body.

Specifically, an output from the infrared detection elements 201 placed in the lattice pattern shown in FIGS. 1A and 1B can be processed by an appropriate signal amplifying circuit and a digital processing circuit, and a mosaic-like image can be taken out. The amount of received infrared rays of each infrared detection element 201 fluctuates according to the movement of the human body. By analyzing time fluctuation data from the infrared detection elements 201 which are placed in the lattice pattern, the movement of the human body can be detected. In addition, a high definition image is not necessary also in terms of human body detection with consideration over personal privacy. When using the pyroelectric infrared sensor 203 according to this exemplary embodiment, a mosaic-like image can be taken out and an individual cannot be identified. Therefore, a sensor for human body detection with consideration on privacy can be realized.

The pyroelectric film which composes the infrared detection element 201 is formed by, for example, the aerosol deposition method which sprays ceramic particulates over the substrate 202 at a high speed, a solution process such as the sol-gel method, and the gas phase process such as the metal organic chemical vapor deposition (MOCV), or the like. Alternatively, a method of manufacturing a pyroelectric plate such as the tape casting method, and bonding it to the substrate 202 can also be used. As an adhesive, an epoxy adhesive can be used, for example. The thickness of the adhesive layer is not especially limited, but an excessive thickness will be a cause to increase an unnecessary electrical resistance component and reduce the infrared detecting sensitivity, thus it is desirable to be 20 µm or less, for example. Note that these methods may be appropriately selected and used according to the material and the shape of the substrate 202.

Figure 2A:
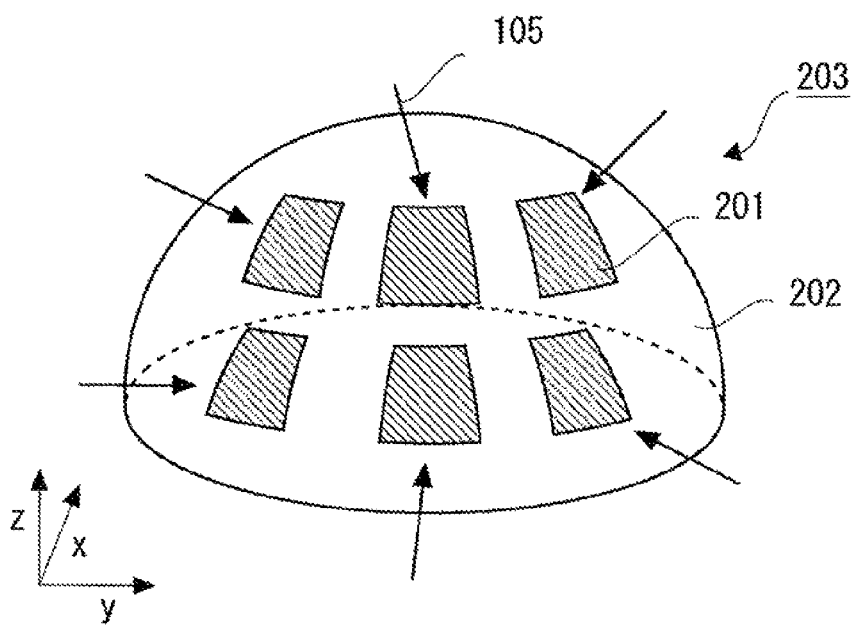
FIG. 2A is a view showing a configuration of another pyroelectric infrared sensor according to the exemplary embodiment.

Further, the shape of the substrate 202 is not limited to the shape shown in FIGS. 1A and 1B. Here, another pyroelectric infrared sensor 203 according to this exemplary embodiment is explained with reference to FIGS. 2A and 2B. FIG. 2A is a perspective view showing a configuration of another pyroelectric infrared sensor 203. FIG. 2A is a cross-sectional diagram showing the configuration of another pyroelectric infrared sensor 203.

Figure 2B:
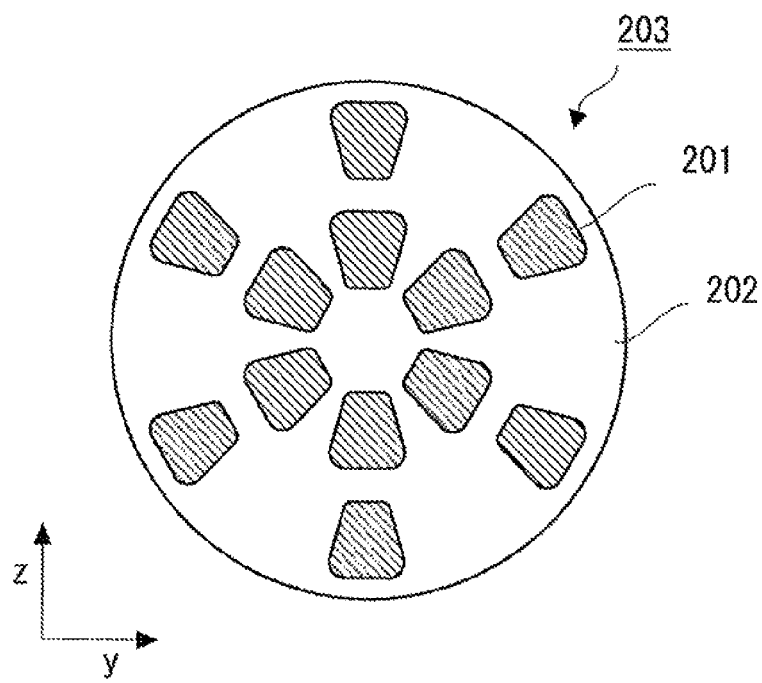
FIG. 2B is a view showing the configuration of another pyroelectric infrared sensor according to the exemplary embodiment.

The top surface of the substrate 202 includes the convex shape projected towards the positive direction of the z axis. In FIGS. 2A and 2B, this convex shape is provided by projecting the substantially central part in the y axis direction and the x axis direction. Accordingly, the top surface of the substrate 202 includes a substantially hemispherical shape. Therefore, unlike FIGS. 1A and 1B, the cross-sectional shape of the top surface of the substrate 202 when cutting vertically in the y axis direction not only in the x axis direction includes a straight line and a curve. Specifically, these cross-sectional shapes are substantially arc shapes. As shown in FIG. 2B, the infrared detection elements 201 are radially provided from the substantially central part of the substrate 202. Specifically, two each of the infrared detection elements 201 are provided in six directions. Then, it is possible to widely detect the infrared distribution change in three-dimensional space.

As described so far, the principal surface which includes the convex shape of the substrate 202 can be a substantially semicircle tubed (FIGS. 1A and 1B) or a substantially hemispherical shape (FIGS. 2A and 2B). Further, it is not limited to this, but may be a shape formed by combination of two or more planar surfaces and curved surfaces. Note that the shape (planar shape) viewed from the principal surface of the substrate 202 or the infrared detection element 201 may be a polygonal shape, such as a substantially rectangular shape, a substantially semicircle shape, a substantially ellipse shape, or the like.

Specifically, the planar shape of the infrared detection elements 201 may be the size of the substrate 202 or less when a plurality of infrared detection elements 201 are placed in the lattice pattern or radially. Further, the thickness of the infrared detection element 201 may be, for example, one µm or more and 100 µm or less. Furthermore, the infrared detection elements 201 are not limited to be placed in the lattice pattern (FIGS. 1A and 1B) or radially (FIGS. 2A and 2B) but may be aligned in one line, for example. Additionally, they may be placed linearly or in a curved line.

In addition, in FIGS. 1A, 1B, 2A, and 2B, although the principal surface which includes the convex shape of the substrate 202 has a curved surface shape since it is easy to form the convex shape, it is not limited to this. This principal surface may include only the planar shape, for example. Specifically, the cross-sectional shape of this principal surface may be an open polygonal shape, such as the shape of V. Moreover, as shown in FIGS. 1A, 1B, 2A, and 2B, the substantially central part of this principal surface may be a projected convex shape, or the section shifted from the central part may be a projected convex shape. Further, a concave shape may be included in a part of this principal surface.

[Detectable Region Evaluation]

The detectionable region of the infrared spatial distribution change of the pyroelectric infrared sensor 203 according to the present invention is evaluated by following examples 1 and 2 and a comparative example 1, and an effect of the pyroelectric infrared sensor 203 according to the present invention is evaluated. Here, the detectionable region of the infrared spatial distribution change is evaluated for each of the x axis direction and the y axis direction in the drawings. Moreover, in the examples 1 and 2, the size of the detectionable region of the pyroelectric infrared sensor 203 of the configuration shown in the comparative example 1 shall be a reference, and when the result is superior, it is indicated as "superior", and when it is inferior, it is indicated as "inferior". Further, the detecting object shall be a moving heat source.

COMPARATIVE EXAMPLE 1

Figure 3A:
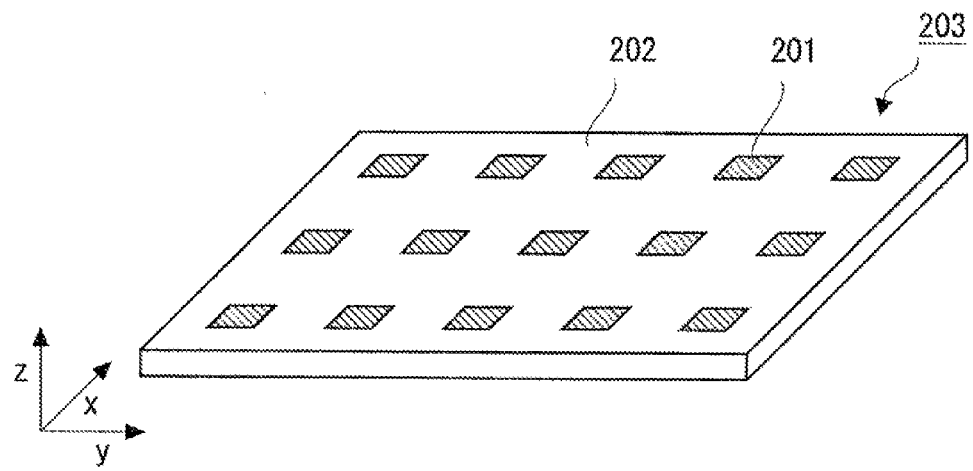
FIG. 3A is a view showing a configuration of a pyroelectric infrared sensor according to a comparative example 1.
Figure 3B:
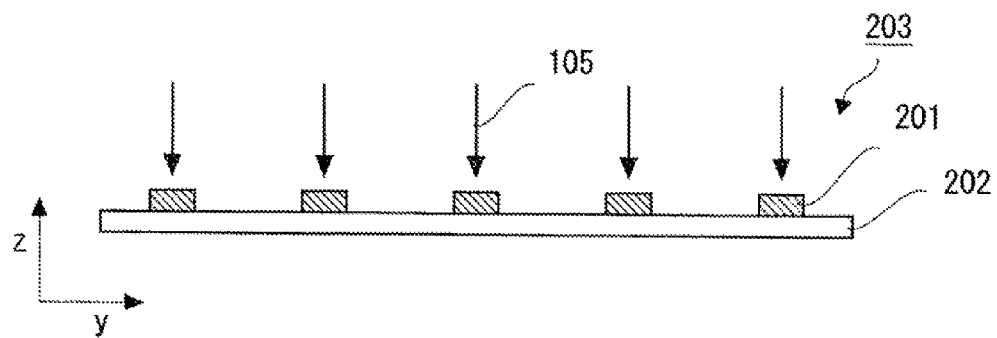
FIG. 3B is a view showing a configuration of a pyroelectric infrared sensor according to the comparative example 1.

The pyroelectric infrared sensor according to this comparative example is explained with reference to FIGS. 3A and 3B. FIG. 3A is a perspective view showing a configuration of the pyroelectric infrared sensor. FIG. 3B is a cross-sectional diagram showing the configuration of the pyroelectric infrared sensor.

As shown in FIGS. 3A and 3B, the pyroelectric infrared sensor 203 was manufactured, in which three rows×five columns of the infrared detection elements 201 are placed to the plane plate rectangular shape substrate 202. Additionally, the infrared detection elements 201 were formed in the lattice pattern with intervals of three mm from each other.

Stainless steel (SUS) was used as the substrate 202. Further, the substrate 202 is a rectangular shape of 45 mm of long sides, and 30 mm of short sides, and 500 µm (0.5 mm) in thickness. Furthermore, as described above, the pyroelectric infrared sensor 203 was composed of the pyroelectric film and the upper electrode layer formed in the top principal surface. As the pyroelectric film, a pyroelectric ceramic film formed of lead zirconate titanate oxide ceramics was used. The pyroelectric ceramic film is a square shape with 5 mm in one side, and a thickness of 15 µm (0.015 mm). As the upper electrode layer, silver/palladium alloy (weight ratio 70%: 30%) was used. Moreover, the upper electrode layer was 5 µm in thickness. Further, the pyroelectric ceramic film was formed by depositing a pyroelectric ceramic material over the substrate 202 by the aerosol deposition method.

EXAMPLE 1

Figure 4:
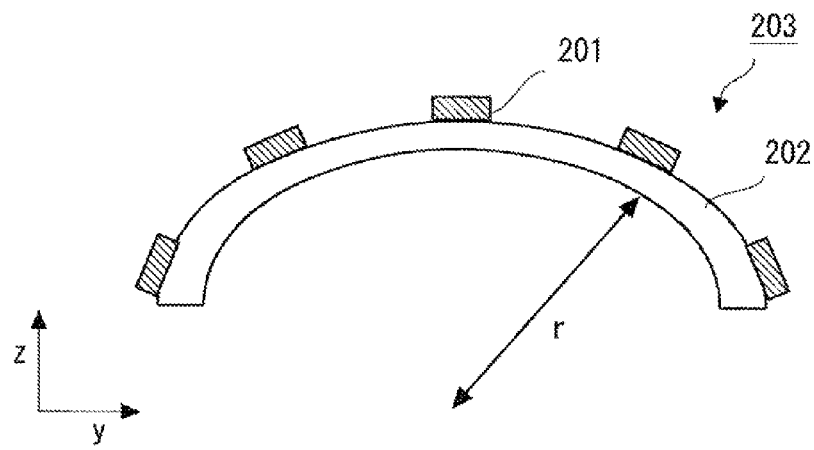
FIG. 4 is a cross-sectional diagram showing a configuration of a pyroelectric infrared sensor according to an example 1.

The pyroelectric infrared sensor 203 according to this example is explained with reference to FIG. 4. FIG. 4 is a cross-sectional diagram showing a configuration of the pyroelectric infrared sensor 203.

In this example, the cross-sectional shape of the substrate 202 in the comparative example 1 was changed. Specifically, the top surface of the substrate 202 was the convex shape projected upward (positive direction of the z axis). This convex shape was provided by projecting the substantially central part in the y axis direction. The cross-sectional shape of the top surface of the substrate 202 was made to be an arc shape with a curvature radius (r in FIG. 4) is 40 mm. However, the cross-sectional shape of the region in which the infrared detection element 201 is formed was made to be a linear shape. The configuration, material, and manufacturing process of each of other parts were same as the comparative example 1.

When evaluating the detectionable region using the pyroelectric infrared sensor 203 according to this exemplary embodiment, the result was as follows.

The detectable region of the x axis direction: Equivalent

The detectable region of the y axis direction: Superior

That is, according to the pyroelectric infrared sensor 203 of this example, it has been clear that the detectable region in the x axis direction was equivalent to the comparative example 1, and the detectable region in the y axis direction was wider than the comparative example 1. As described above, by the top surface (principal surface) including the convex shape, the viewing angle expansion effect was proved. Moreover, the thickness of the pyroelectric infrared sensor 203 according to this exemplary embodiment (the thickness including the substrate 202, the pyroelectric ceramics film, and the adhesive layer) is approximately 10 mm, thus the height is sufficiently reduced as an array-like sensor and also realized a low-cost configuration. Further, the sensor size is appropriately selected according to the usage, and further reduction in size can be possible.

EXAMPLE 2

Figure 5:
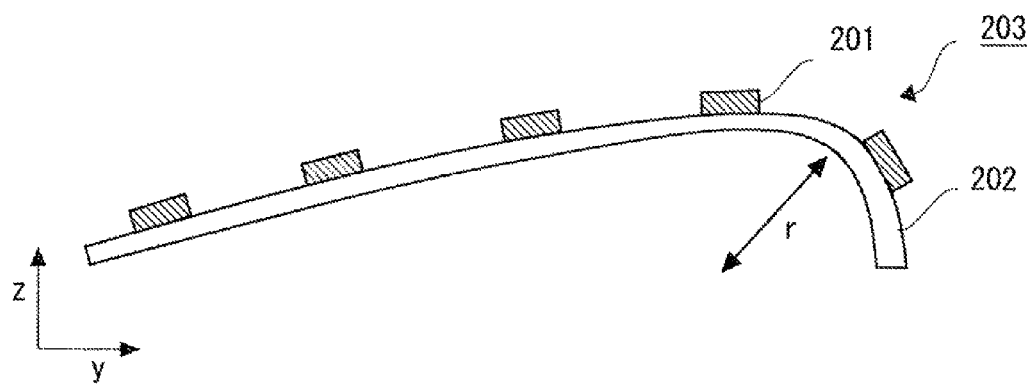
FIG. 5 is a cross-sectional diagram showing a configuration of a pyroelectric infrared sensor according to an example 2.

The pyroelectric infrared sensor 203 according this example is explained with reference to FIG. 5. FIG. 5 is a cross-sectional diagram showing a configuration of the pyroelectric infrared sensor 203.

In this example, the cross-sectional shape of the substrate 202 in the comparative example 1 was changed. Specifically, the top surface of the substrate 202 was made to be a convex shape projecting upward (the positive direction of the z axis). This convex shape was provided by projecting the section closer to the positive direction side of the y axis from the central part of the y axis direction. Specifically, at the section 20 mm away from one end of the longitudinal direction of the substrate 202, the cross-sectional shape of the top surface of the substrate 202 was made to be an arc shape with a curvature radius (r in FIG. 5) of 20 mm. However, the cross-section of the region in which the infrared detection element 201 is formed was made to be a linear shape. The configuration, material, and manufacturing process of each of other parts were same as the comparative example 1.

When evaluating the detectionable region using the pyroelectric infrared sensor 203 according to this exemplary embodiment, the result was as follows.
The detectable region of the x axis direction: Equivalent
The detectable region of the y axis direction: Superior [0051]
That is, according to the pyroelectric infrared sensor 203 of this example, it can be seen that the detectable region in the x axis direction was equivalent to the comparative example 1, and the detectable region in the y axis direction was wider than comparative example 1. Further, the detectable region in the y axis direction includes a wide detectable region especially in the positive direction of the y axis. As described above, by the top surface (principal surface) of the substrate 202 including the convex shape, the viewing angle expansion effect was proved. Moreover, the thickness of the pyroelectric infrared sensor 203 according to this exemplary embodiment (the thickness including the substrate 202, the pyroelectric ceramics film, and the adhesive layer) was approximately 10 mm, thus the height was sufficiently reduced as an array-like sensor and also realized a low-cost configuration. Further, the sensor size was appropriately selected according to the usage, and further reduction in size can be possible.

[Human Body Detection Evaluation]

A human body detection evaluation was performed using the pyroelectric infrared sensor 203 evaluated in the example 1. Specifically, the configuration, material, and manufacturing process of each of other parts were same as the comparative example 1, and electrical signals from the infrared detection elements 201 were imaged through the signal amplifying circuit and the signal processing circuit.

Figure 6:
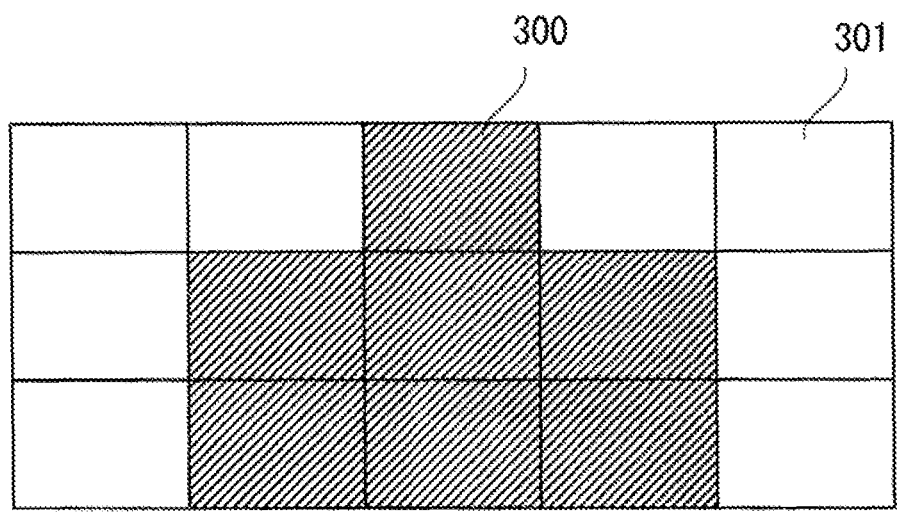
FIG. 6 is a schematic diagram showing a result of a body detection evaluation.

When a human body existed in the front of the pyroelectric infrared sensor 203, the image as shown in FIG. 6 was obtained. FIG. 6 is a schematic diagram showing the result of the human body detection evaluation. In FIG. 6, a pixel 300 displayed as shaded corresponds to the infrared detection element 201 which detected a change in infrared rays. Accordingly, it corresponds to the infrared detection element 201 indicating an existence of the human body. Moreover, a pixel 301 displayed in white corresponds to the infrared detection element 201 which has not detected the change in the infrared rays. That is, it corresponds to the infrared detection element 201 which does not indicate an existence of the human body.

As shown in FIG. 6, the human body which existed in the front of the pyroelectric infrared sensor 203 became a mosaic-like image, and was visualized. In addition, as it is extremely difficult to identify an individual from the mosaic-like image, it was proved that it functions as a sensor for human body detection with consideration over privacy. Further, by the substantially entire light-receiving surface of the infrared detection element 201 including the planar shape, an accurate image with almost no "smearing" and "blurring".

As described above, according to the present invention, it is possible to obtain an infrared sensor such as a small-sized pyroelectric infrared sensor with a improved viewing angle and detection accuracy. Accordingly, a small-sized infrared sensor with improved quality can be obtained.

As mentioned above, although the present invention has been explained with reference to the exemplary embodiment, the present invention is not limited by above. Various modifications that can be understood by a person skilled in the art within the scope of the invention can be made to the configuration and detail of the present invention.

The present application claims priority rights of and is based on Japanese Patent Application No. 2009-120127 filed on May 18, 2009 in the Japanese Patent Office, the entire contents of which are hereby incorporated by reference.

INDUSTRIAL APPLICABILITY

The present invention can be applied to an infrared sensor, an electronic device, and a manufacturing method of the infrared sensor.

REFERENCE SIGNS LIST 101 and 201 INFRARED DETECTION ELEMENT
102 and 202 SUBSTRATE
103 OPTICAL DIFFRACTION LENS
104 OPTICAL FILTER
105 INFRARED RAYS
203 PYROELECTRIC INFRARED SENSOR
300 and 301 PIXEL

The invention claimed is:
1. An infrared sensor comprising:
a convex-shaped substrate comprising a principal surface; and
a plurality of infrared detection elements provided on the principal surface, each of the plurality of infrared detection elements comprising a substrate contacting surface which contacts the convex-shaped substrate and a planar light-receiving surface which is configured to receive infrared rays,
wherein the substrate contacting surface is disposed opposite from the planar light-receiving surface.
2. The infrared sensor according to claim 1, wherein
the convex-shaped substrate comprises a planar surface on the principal surface, and
the infrared detection element is formed only over the planar surface.

3. The infrared sensor according to claim 2, wherein the vex-shaped substrate comprises a curved surface on the principal surface,
   wherein the curved surface is provided between adjacent infrared detection elements of the plurality of infrared detection elements.

4. The infrared sensor according to claim 3, wherein the principal surface of the convex-shaped substrate comprises a shape of any one of a hemispherical shape, a semicylindrical shape, and two or more planar surfaces and curved surfaces.

5. The infrared sensor according to claim 1, wherein the infrared detection element includes a pyroelectric member including a pyroelectric effect or a ferroelectric member.

6. An electronic device comprising the infrared sensor according to claim 1,
   wherein a temperature distribution change in space is detected by the infrared sensor.

7. An electronic device according to the infrared sensor according to claim 1, wherein a movement of a human body is detected by the infrared sensor.

8. A manufacturing method of an infrared sensor comprising:
   providing a convex-shaped substrate comprising a principal surface; and
   forming a plurality of infrared detection elements on the principal surface,
   wherein each of the plurality of infrared detection elements comprising a substrate contacting surface which contacts the convex-shaped substrate and a planar light-receiving surface which is configured to receive infrared rays,
   wherein the substrate contacting surface is disposed opposite from the planar light-receiving surface.

9. The manufacturing method of the infrared sensor according to claim 8, wherein the forming the plurality of infrared detection elements comprises forming an infrared detection material over the convex-shaped substrate by an aerosol deposition method.

* * * * *